United States Patent [19]

Cooper et al.

[11] Patent Number: 5,246,537
[45] Date of Patent: Sep. 21, 1993

[54] METHOD OF FORMING RECESSED OXIDE ISOLATION

[75] Inventors: Kent J. Cooper; Scott S. Roth; Wayne J. Ray; Howard C. Kirsch, all of Austin, Tex.

[73] Assignee: Motorola, Inc., Schaumburg, Ill.

[21] Appl. No.: 876,146

[22] Filed: Apr. 30, 1992

[51] Int. Cl.$^5$ ........................................... H01L 21/306
[52] U.S. Cl. ..................................... 156/649; 156/656; 437/61; 437/69
[58] Field of Search .............. 156/649, 656, 654, 655, 156/657; 148/DIG. 50; 437/61, 62, 67, 78, 79, 69; 357/49

[56] References Cited

U.S. PATENT DOCUMENTS

| | | | |
|---|---|---|---|
| 3,961,999 | 6/1976 | Antipov | 148/175 |
| 4,398,992 | 8/1983 | Fang et al. | 156/643 |
| 4,472,240 | 9/1984 | Kameyama | 156/648 |
| 4,923,563 | 5/1990 | Lee et al. | 156/649 |
| 4,927,780 | 5/1992 | Roth et al. | 437/69 |

OTHER PUBLICATIONS

Kaga, T. et al., "Advanced OSELO Isolation with Shallow Grooves for High-Speed Submicrometer ULSI's", IEEE Transactions on Electron Devices, vol. ED35, No. 7, Jul., 1988, pp. 893-898.

Primary Examiner—R. Bruce Breneman
Attorney, Agent, or Firm—Maurice Jones; James L. Clingan, Jr.

[57] ABSTRACT

A method requiring only a single mask results in an isolation oxide (50) which is the same size as, instead of becoming larger than, the dimension originally defined by the lithographic system. A buffer layer (14) is formed over the substrate (12). An oxidation resistant layer (16) is formed over the buffer layer (14). The oxidation resistant layer (16) is etched and a disposable sidewall spacer (30) is formed adjacent to the sidewall of the oxidation resistant layer (28), and a trench region is defined (36). The trench region (36) is etched to form a trench. The disposable sidewall spacer (30) is removed and a conformal layer (48) of oxidizable material is deposited over the trench sidewall (40) and the trench bottom surface (38). The conformal layer (48) is then oxidized to form electrical isolation in the isolation regions (26) of the substrate (12).

80 Claims, 6 Drawing Sheets

METHOD OF FORMING RECESSED OXIDE ISOLATION

FIELD OF THE INVENTION

This invention relates generally to semiconductor devices, and more specifically to a process for the formation of electrical isolation structures in a semiconductor integrated circuit.

BACKGROUND OF THE INVENTION

The semiconductor industry continually strives to increase device performance by reducing device dimensions and increasing device packing densities. For a given chip size, increasing the device packing density can be achieved by reducing the lateral distance separating active devices, which can be achieved with a reduction in isolation width. The desire to reduce isolation width, while maintaining the necessary electrical isolation between adjacent active devices, has led to the development of several different dielectric isolation schemes.

One form of dielectric isolation is Recessed Oxide Isolation (ROI). In this approach, a mask overlying a silicon substrate is patterned such that the substrate is exposed in regions where dielectric isolation is to be formed. The exposed silicon regions are then etched, forming trenches in the substrate. During trench formation, unexposed portions of the silicon substrate are protected by an overlying mask. The trench regions are then thermally oxidized to form recessed oxide isolation regions. Thus, in this approach the mask serves both as an etch barrier during trench formation and as an oxidation barrier during trench oxidation. A composite mask of silicon dioxide and silicon nitride has been widely used for this dual purpose. However, a problem with this technique is that regions of silicon underneath edges of the silicon nitride mask are also oxidized due to lateral oxidation. This phenomenon, known as field oxide encroachment, results in the final width of the electrical isolation region being larger than is necessary. Thus, due to field oxide encroachment, a limited increase in device packing density can be achieved with ROI.

The desire to suppress field oxide encroachment has lead to the development of complicated process techniques that seal the sidewall of both the trench and the patterned composite mask in order to prevent or retard lateral oxidation, for example, as described by R. Fang in U.S. Pat. No. 4,398,992. In these techniques a film of silicon nitride or silicon dioxide is frequently used to form the sidewall oxidation seal. However, the additional stress generated by these sealing techniques during trench oxidation creates crystalline defects in the silicon substrate that degrade both device performance and reliability. Additionally, these complicated process techniques are difficult to control and frequently fail to reduce lateral oxidation. Accordingly, a need exists for a ROI process that effectively and reproducibly reduces lateral oxidation and provides stress relief during trench oxidation in order to prevent the generation of substrate defects.

SUMMARY OF THE INVENTION

The previously mentioned problems with existing ROI processes are overcome by the present invention. In one embodiment of the invention, electrical isolation is formed by providing a semiconductor substrate. A buffer layer is formed over the substrate. An oxidation resistant layer is formed over the buffer layer. The oxidation resistant layer is etched to define an isolation region of the substrate and to leave a portion of the oxidation resistant layer overlying the substrate. A disposable sidewall spacer is formed laterally adjacent to the sidewall of the oxidation resistant layer and a trench region is defined. The trench region is etched to form a trench. The disposable sidewall spacer is removed. A conformal layer of oxidizable material is deposited over the oxidation resistant layer, the trench sidewall, and the trench bottom surface. The conformal layer of oxidizable material is then oxidized to form electrical isolation in the isolation regions of the substrate. These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
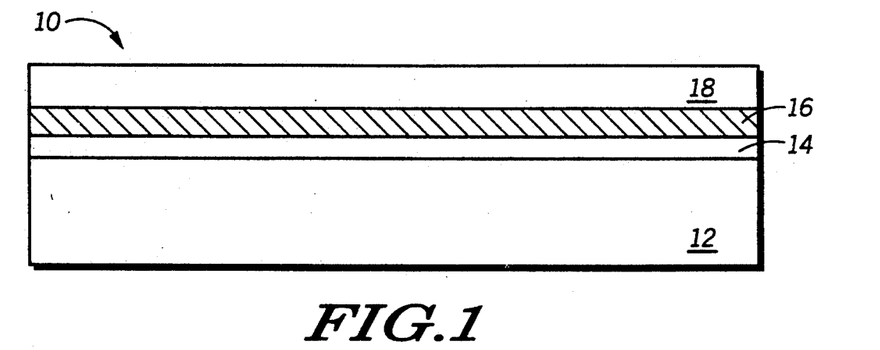
FIGS. 1–12 illustrate, in cross-section, process steps in accordance with one embodiment of the invention.

FIGS. 1 through 12 illustrate, in cross-section, process steps in accordance with one embodiment of the invention wherein electrical isolation structures are formed in an integrated circuit. Shown in FIG. 1 is a portion 10 of an integrated circuit structure comprising a silicon substrate 12, a buffer layer 14, a silicon nitride layer 16, and a masking layer 18. Substrate 12 is preferably thermally oxidized to form buffer layer 14, which may have a thickness ranging from 10 to 100 nanometers. Alternatively, buffer layer 14 may be chemical vapor deposited silicon dioxide. Following the formation of buffer layer 14, nitride layer 16, which is oxidation resistant, is deposited by chemical vapor deposition onto buffer layer 14. In accordance with a preferred embodiment, nitride layer 16 is deposited with a thickness ranging from 50 to 200 nanometers. Silicon nitride layer 16 could also be substituted with another oxidation resistant material, such as oxynitride. After nitride layer 16 is formed, a masking layer 18 may be deposited over nitride layer 16. In accordance with a preferred embodiment, masking layer 18 is a chemical vapor deposited silicon dioxide.

Figure 2:
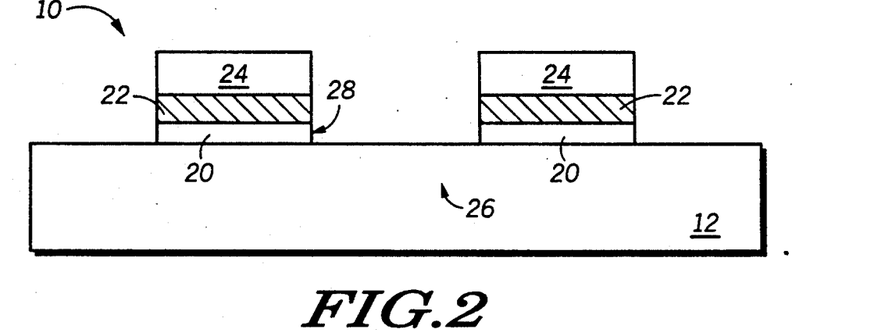

The process continues, in a preferred embodiment, as shown in FIG. 2, with a selective anisotropic etch leaving portions of the buffer layer 20, nitride layer 22, and masking layer 24 overlying substrate 12, and defining an isolation region 26 of the substrate 12. The anisotropic etch proceeds in the vertical direction faster than in the horizontal thus yielding a straight buffer layer sidewall 28, as illustrated in FIG. 2.

Figure 3:
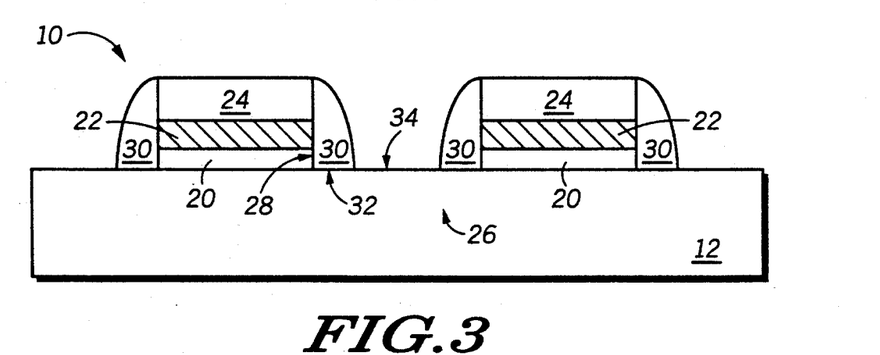

Referring to FIG. 3, the process continues with a low pressure chemical vapor deposition of a silicon dioxide layer, which is very conformal, and which overlies nitride layer 22 and isolation region 26. After the conformal silicon dioxide layer is deposited, an anisotropic etch is performed to form a sidewall spacer 30 laterally adjacent to buffer layer sidewall 28, and covering a first portion 32 of isolation region 26, and to expose a second portion 34 of isolation region 26. The formation of sidewall spacers by depositing a layer of spacer material which conforms to the underlying contour, and then anisotropically etching is well known.

Figure 4:
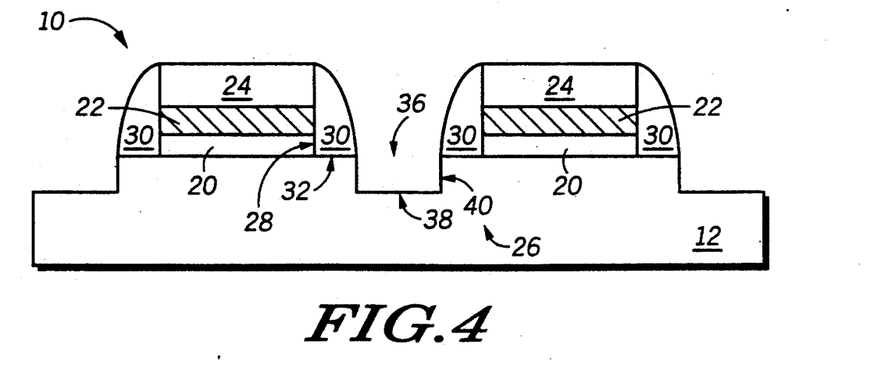

The process continues, in a preferred embodiment, as shown in FIG. 4, with a selective anisotropic etch of exposed second portion 34 to form a trench region 36 in substrate 12 having a trench bottom surface 38 and a trench sidewall 40. At this step it should be noted, that masking layer 24 may be optional if substrate 12 is etched with an etchant which is selective with respect to nitride layer 22. Additionally, trench region 36 may be doped using an ion implantation or diffusion step.

Following trench formation, sidewall spacer 30, which is disposable, is removed with an isotropic etch and first portion 32 of isolation region 26 is exposed. In this same step, buffer layer sidewall 28 is etched, a recess 42 is formed underneath an edge portion of nitride layer 22, because the etch is isotropic, and a portion 44 of substrate 12 is exposed. Additionally, remaining portions of masking layer 24 are also removed during this step, which results in the structure shown in FIG. 5. Recess 42 may have a lateral dimension ranging from 10 to 100 nanometers. In accordance with the preferred embodiment, a wet oxide etchant is used to remove sidewall spacer 30 and form recess 42. If disposable spacer 30 and buffer layer 20 are composed of materials that do not etch in the same etchant, then separate etching steps may be used to first remove sidewall spacer 30 and then etch buffer layer sidewall 28 to form recess 42. The resulting structure is the same as that shown in FIG. 5.

Figure 6:
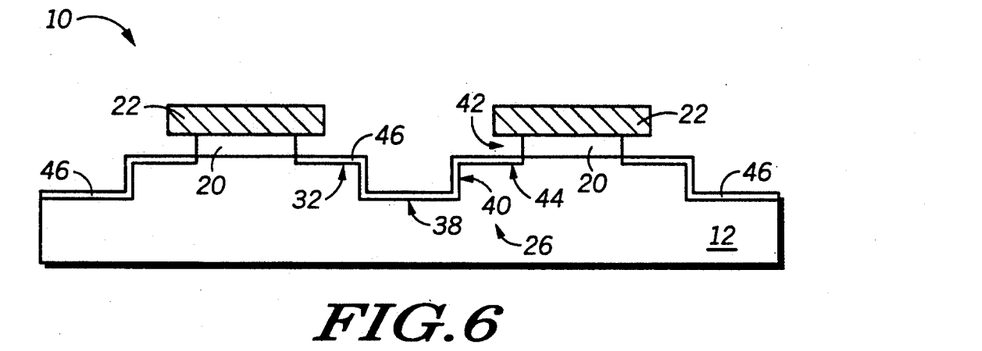

Once recess 42 is formed, a thin oxide layer 46 is formed on exposed portion 44, first portion 32 of isolation region 26, trench sidewall 40, and trench bottom surface 38, as shown in FIG. 6. In accordance with the preferred embodiment, exposed portion 44, first portion 32 of isolation region 26, trench sidewall 40, and trench bottom surface 38 are thermally oxidized to form a thin oxide layer 46 having a thickness ranging from 2 to 10 nanometers. Alternatively, thin oxide layer 46 may be a chemical vapor deposited silicon dioxide.

Figure 7:
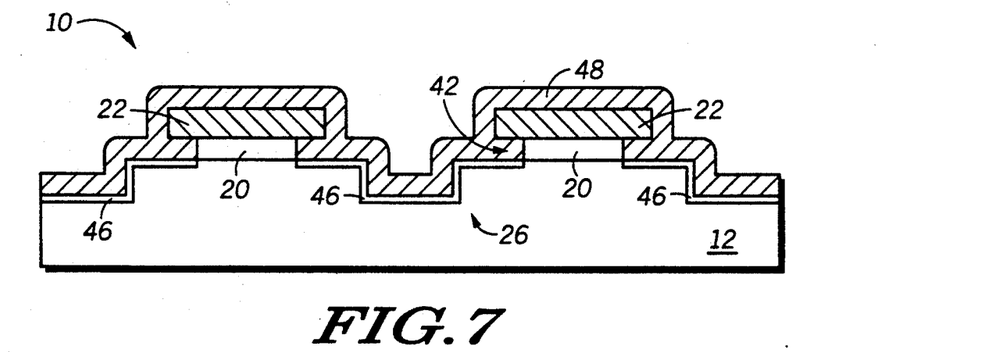

Referring to FIG. 7, the process continues with the deposition of a polysilicon layer 48, which is very conformal, and which overlies nitride layer 22, thin oxide layer 46, and substantially fills recess 42. Polysilicon layer 48 is preferably chemical vapor deposited with a thickness of about 50 nanometers. Alternatively, another material which is both oxidizable and conforms to the underlying contour, and which can be readily converted to a material useful for isolation, could be used.

Figure 8:
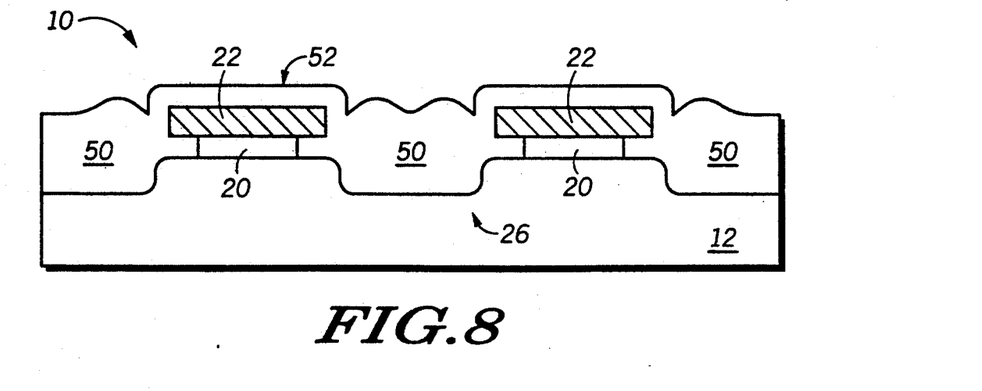

After polysilicon layer 48 has been deposited, an oxidation is performed to grow a thick isolation oxide 50 within isolation region 26, as shown in FIG. 8. The oxidation process is preferably carried out in an oxidation furnace at about 900 to 1200 degrees Celsius in the presence of nitrogen and steam. In accordance with the preferred embodiment, the oxidation process completely consumes polysilicon layer 48 converting the layer to silicon dioxide, thus forming an oxidized conformal layer of polysilicon 52.

Figure 9:
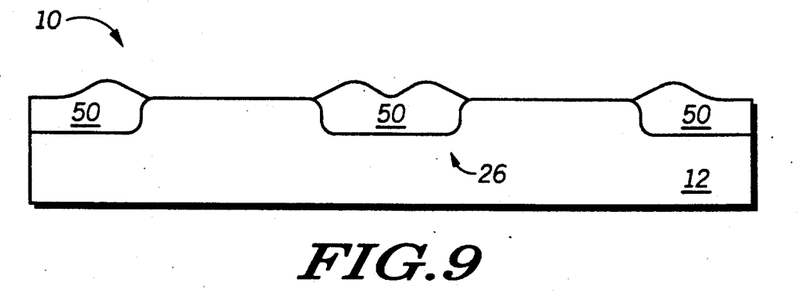

The process is completed with the removal of portions of oxidized conformal layer 52, nitride layer 22, and buffer layer 20, as shown in FIG. 9. Transistors can then be formed in active regions separated by isolation oxide 50.

Figure 10:
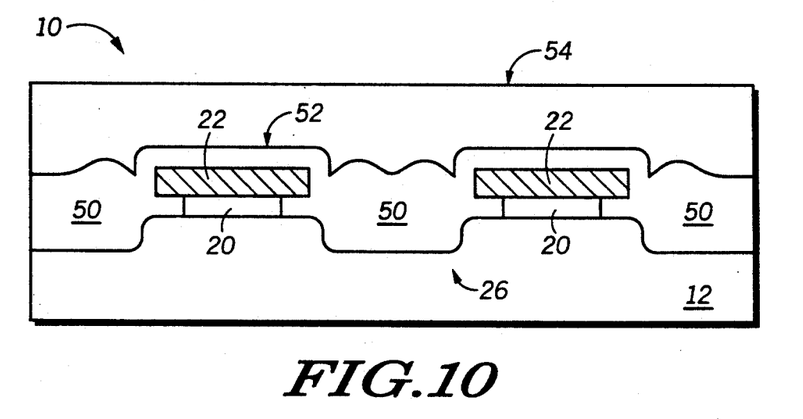

Shown in FIG. 10 is the structure of FIG. 8 with a relatively planar layer of silicon dioxide 54 deposited over the structure. This is an alternative to simply removing portions of oxidized conformal layer 52, nitride layer 22, and buffer layer 20 to obtain the structure shown in FIG. 9.

Figure 11:
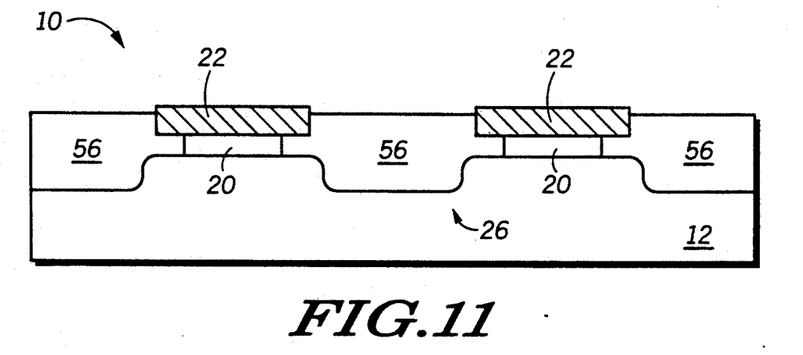

After silicon dioxide layer 54 is deposited, portions of silicon dioxide layer 54, oxidized conformal layer 52, and isolation oxide 50 are etched. This forms an isolation oxide 56 and also results in isolation region 26 being substantially planar with nitride layer 22, as shown in FIG. 11.

Figure 12:
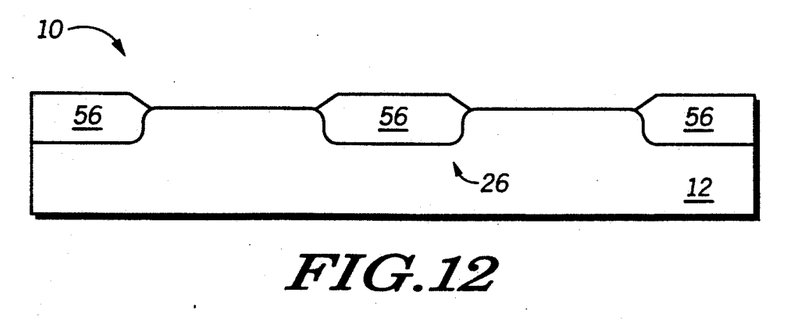

The process is then completed with the removal of nitride layer 22 and buffer layer 20, as shown in FIG. 12. Once again, transistors can now be formed on the active regions separated by isolation oxide 56.

Figure 13:
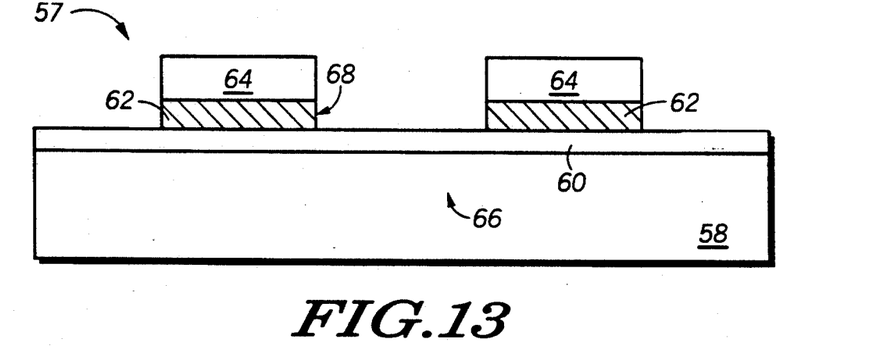
FIGS. 13–16 illustrate, in cross-section, process steps in accordance with a second embodiment of the invention.

Shown in FIG. 13 is a portion 57 of an integrated circuit structure comprising a silicon substrate 58, a buffer layer 60 analogous to buffer layer 14 of FIG. 1, a silicon nitride layer 62 analogous to nitride layer 22 of FIG. 2, a masking layer 64, analogous to masking layer 24 of FIG. 2, and a isolation region 66. In this alternative embodiment an anisotropic etch is performed, on a structure which is the same as that shown in FIG. 1, to leave masking layer 64 and nitride layer 62 overlying buffer layer 60, and to define isolation region 66 of substrate 58. Additionally, the anisotropic etch proceeds in the vertical direction faster than in the horizontal thus yielding a straight nitride layer sidewall 68, as illustrated in FIG. 13. Buffer layer 60 is not etched at this time in contrast to FIG. 2, wherein analogous buffer layer 14 is etched to leave buffer layer 20 overlying substrate 12.

Figure 14:
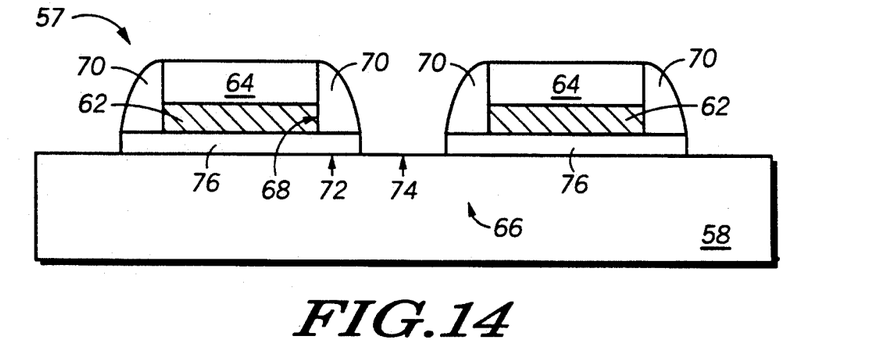

Referring to FIG. 14, the process continues with a low pressure chemical vapor deposition of silicon dioxide, which is conformal, and which overlies nitride layer 62 and isolation region 66. After the conformal silicon dioxide layer is deposited, an anisotropic etch is performed to form a sidewall spacer 70 laterally adjacent to nitride layer sidewall 68, and covering a first portion 72 of the isolation region 66, and exposing a portion of the buffer layer, which is also anisotropically etched during this step to expose a first portion 74 of substrate 58, and to leave portions of the buffer layer 76 overlying substrate 58. The formation of sidewall spacers by depositing a layer of spacer material which conforms to the underlying contour, and then anisotropically etching is well known. If the anisotropic etch used to form sidewall spacer 70 is selective to buffer layer 60, then two separate anisotropic etch steps can be used. With the first etch, sidewall spacer 70 is formed and in the second etch buffer layer 60 is etched to expose first portion 74. The resulting structure in such a case is the same as the structure shown in FIG. 14.

Figure 15:
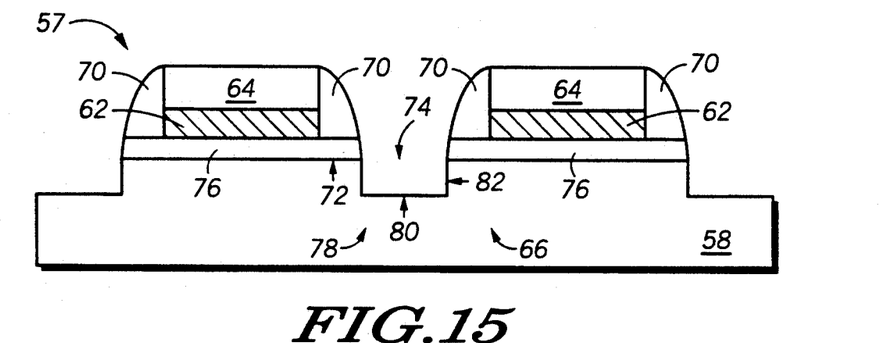

The process continues, as shown in FIG. 15, with a selective anisotropic etch of exposed first portion 74 to form a trench region 78 in substrate 58 having a trench bottom surface 80 and a trench sidewall 82. At this step it should be noted, that masking layer 64 may be optional if substrate 58 is etched with an etchant which is selective with respect to nitride layer 62. Additionally, trench region 78 can be doped using an ion implantation or diffusion step.

Following trench formation, sidewall spacer 70, which is disposable, is removed with an isotropic etch.

In this same step, buffer layer 76 is etched, a recess 84 is formed underneath an edge portion of nitride layer 62, because the etch is isotropic, and a portion 86 of substrate 12 is exposed. Additionally, remaining portions of masking layer 64 are also removed during this step, which results in the structure shown in FIG. 16, and which is identical to the structure shown in FIG. 5. Additionally, if disposable spacer 70 and buffer layer 76 are composed of materials that do not etch in the same etchant, then separate etching steps may be used to first remove sidewall spacer 70 and then etch buffer layer 76 to form recess 84. The resulting structure in such a case would be the same as the structure shown in both FIG. 16 and in FIG. 5.

Following the formation of recess 84, processing continues with the steps previously described in FIG. 6 through FIG. 12.

Figure 17:
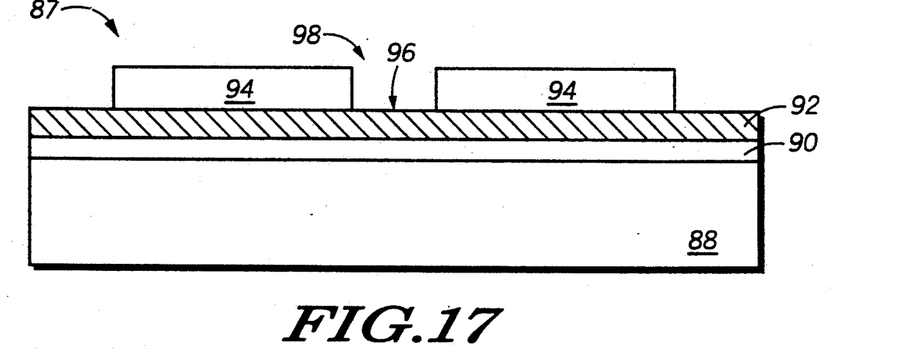
FIGS. 17–21 illustrate, in cross-section, process steps in accordance with a third embodiment of the invention.

Shown in FIG. 17 is a portion 87 of an integrated circuit structure comprising a silicon substrate 88, a buffer layer 90 analogous to buffer layer 14 of FIG. 1, a silicon nitride layer 92 analogous to nitride layer 16 of FIG. 1, a masking layer 94 analogous to masking layer 24 of FIG. 2, and a trench region 98. In this alternative embodiment an anisotropic etch is performed, on a structure which is the same as that shown in FIG. 1, to leave masking layer 94 overlying nitride layer 92, to expose a portion 96 of nitride layer 92, and to define trench region 98.

Figure 18:
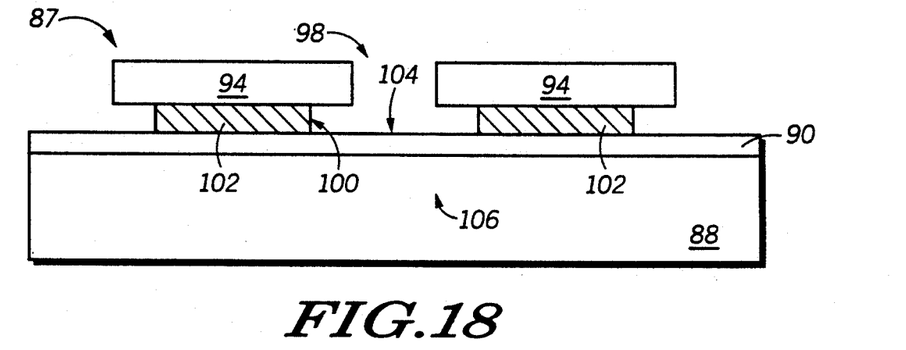

The process continues, as shown in FIG. 18, with a selective anisotropic etch of exposed portion 96 to form a nitride layer sidewall 100. Using an isotropic etch nitride layer sidewall 100 is then laterally recessed underneath masking layer 94 to leave portions of the silicon nitride layer 102 overlying buffer layer 90 and underlying masking layer 94, and exposing a portion 104 of the buffer layer 90, and defining an isolation region 106 of substrate 88. Alternatively, a structure similar to that shown in FIG. 18 could be achieved with only an isotropic etch.

Figure 19:
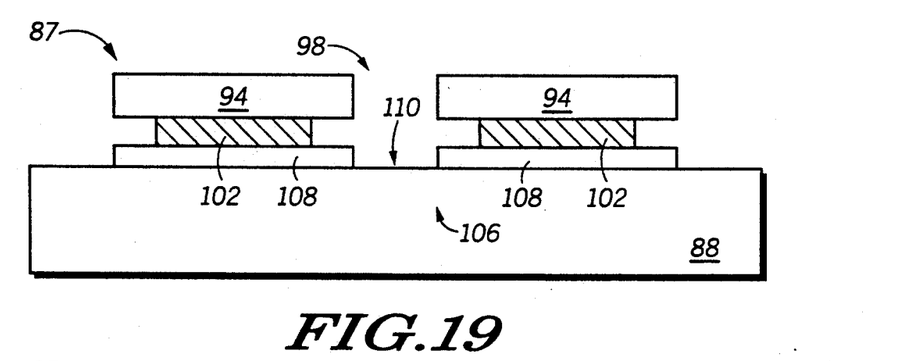

Referring to FIG. 19, the process continues with a selective anisotropic etch of exposed portion 104 to leave portions of the buffer layer 108 overlying substrate 88, and exposing a first portion 110 of substrate 88.

Figure 20:
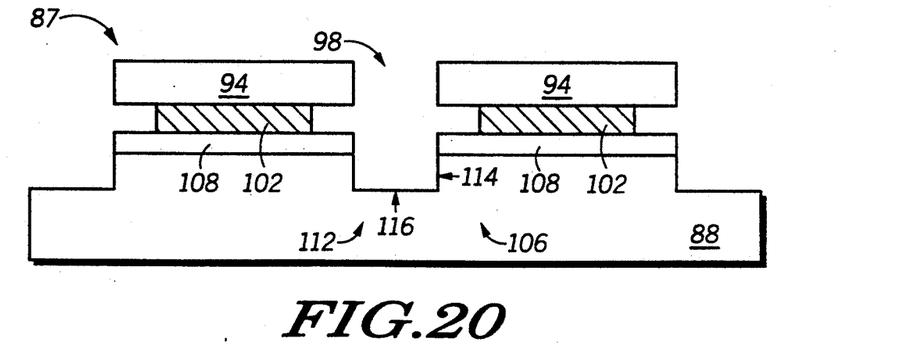

Exposed first portion 110 in trench region 98 is then selectively anisotropically etched to form a trench 112 in substrate 88 having a trench sidewall 114 and a trench bottom surface 116, as shown in FIG. 20. Additionally, trench 112 can be doped using an ion implantation or diffusion step.

Figure 21:
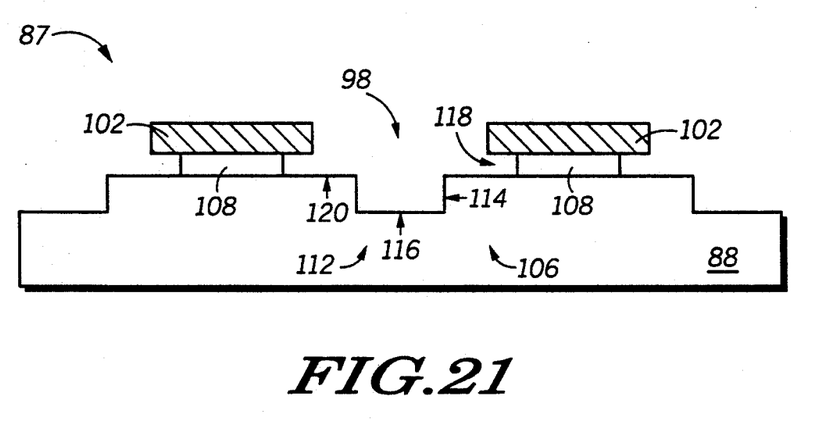

After trench formation, masking layer 94 is removed with a selective isotropic etch. In this same step, buffer layer 108 is etched, a recess 118 is formed underneath an edge portion of nitride layer 102, because the etch is isotropic, and a portion 120 of substrate 88 is exposed. The resulting structure, as shown in FIG. 21, is the same as both FIG. 5 and FIG. 16. Additionally, if masking layer 94 and buffer layer 108 are composed of materials that do not etch in the same etchant, then separate etching steps may be used to remove masking layer 94 and to etch buffer layer 108 to form recess 118. The resulting structure in such a case would be the same as the structure shown in FIG. 21, FIG. 16, and FIG. 5. Alternatively, in FIG. 18, recess 118 may be formed when exposed portion 104 is etched to leave buffer layer 108 overlying substrate 88. The resulting structure in such a case would once again be the same as the structure shown in FIG. 21, FIG. 16, and FIG. 5.

Following the formation of recess 118 to result in the structure shown in FIG. 21, processing continues with the steps previously described in FIG. 6 through FIG. 12.

Figure 5:
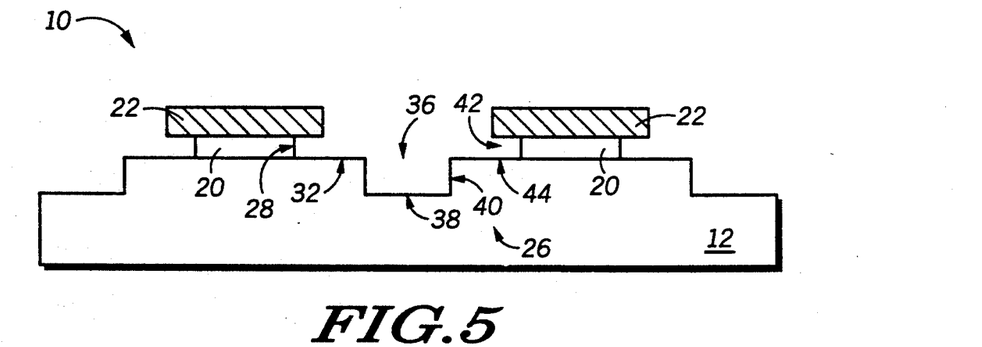
Figure 16:
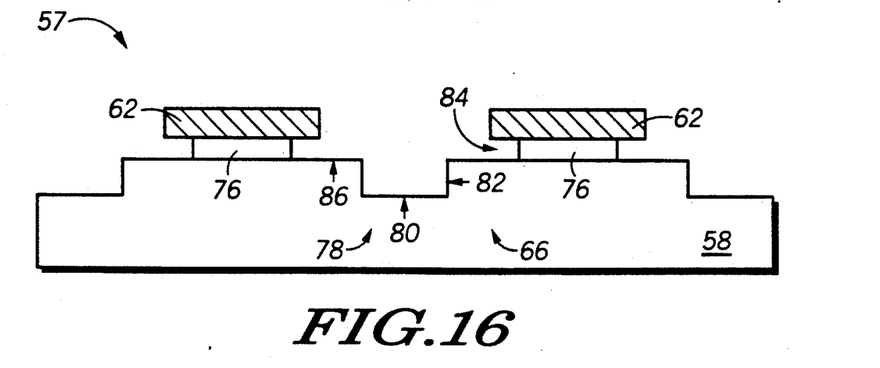

The foregoing description and illustrations contained herein demonstrate many of the advantages associated with the present invention. One advantage is that a trench is formed which is self-aligned to, but offset from, the edge of the oxidation resistant layer, as shown in FIG. 5, wherein the trench is shown to be self-aligned to, but offset from the edge of nitride layer 22. Therefore, a portion of the trench sidewall can be laterally oxidized without the final width of the oxide isolation becoming larger than the intended width. In addition, the techniques used to form the offset trench also allow dopants, which may be introduced into the trench, to be offset from the edge of the nitride layer. Therefore, dopant encroachment of the active area can be minimized. Additionally, the disposable sidewall spacer technique also minimizes field thinning in isolation regions with narrow widths. Another advantage is that the offset trench structure, along with its inherent benefits, can be easily combined with a recess structure, as shown in FIG. 5, FIG. 16, and FIG. 21. Therefore, a polysilicon filled recess, with its known advantages, can be successfully coupled with the offset trench structure to further reduce lateral oxidation. This beneficial combination results in a nearly planar recessed oxide isolation that has a final physical isolation width which is nearly the same as the originally defined lithographic dimension. This defined lithographic dimension may be the smallest feature size that the lithographic equipment is capable of defining. A disadvantage of prior art recessed field oxides is that during the formation thereof, they often expanded beyond the originally defined dimension. In such a case the resulting field oxide was often larger than was necessary to provide the requisite isolation. Therefore, field oxide encroachment is substantially reduced over existing recessed oxide isolation schemes. In addition, thin oxide layer 46 and polysilicon layer 48 provide critical stress relief during the oxidation process. Consequently, substrate defect generation is substantially reduced over existing recessed oxide isolation schemes. Therefore, devices with increased packing densities, high reliability, and improved performance can be achieved with this invention.

Thus it is apparent that there has been provided, in accordance with the invention, a method for forming recessed oxide isolation that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, in some applications thin oxide layer 46 may be optional and the conformal layer of oxidizable material may be deposited directly on the trench sidewall and trench bottom surface. In addition, the invention is not limited to the deposition and etch methods described. For example, in some applications an isotropic etch, instead of an anisotropic etch, may be used for trench formation. It is also important to note that the present invention is not limited in any way to specific layer thicknesses or other dimensions as specifically mentioned. Furthermore, this invention is not limited to those materials specifically described. For example, a conformal layer of silicon rich-oxide could be substituted for polysilicon layer 48. Therefore, it is intended that this invention encompass all such variations and modifications as fall within the scope of the appended claims.

We claim:

1. A method for forming an integrated circuit device on a semiconductor substrate comprising the steps of:
   forming a buffer layer overlying the substrate;
   forming an oxidation resistant layer overlying the buffer layer;
   etching the oxidation resistant layer to leave a first portion of the oxidation resistant layer overlying the substrate, and to define an isolation region of the substrate, and to form a sidewall of the first portion of the oxidation resistant layer;
   forming a disposable sidewall spacer laterally adjacent to the sidewall of the first portion of the oxidation resistant layer and defining a trench region adjacent to the sidewall spacer;
   etching the trench region adjacent to the sidewall spacer to form a trench having a trench sidewall and a trench bottom surface;
   removing the disposable sidewall spacer;
   depositing a conformal layer of oxidizable material overlying the first portion of the oxidation resistant layer, the trench sidewall, and the trench bottom surface; and
   oxidizing said conformal layer of oxidizable material to form an oxidized conformal layer and to form electrical isolation in the isolation region of the substrate.

2. The method of claim 1 further comprising the step of:
   removing portions of the oxidized conformal layer, said first portion of the oxidation resistant layer, and portions of the buffer layer.

3. The method of claim 1 further comprising the step of:
   doping the trench.

4. The method of claim 1 further comprising the step of:
   depositing a dielectric layer overlying portions of the oxidized conformal layer.

5. The method of claim 4 further comprising the steps of:
   removing portions of both the oxidized conformal layer and the dielectric layer resulting in said first portion of the oxidation resistant layer being substantially planar with the isolation region of the substrate; and
   removing said first portion of the oxidation resistant layer, and portions of the buffer layer.

6. The method of claim 1 wherein the substrate is silicon and the step of forming a buffer layer further comprises the step of:
   oxidizing silicon to form the buffer layer.

7. The method of claim 1 wherein the buffer layer is chemical vapor deposited silicon dioxide.

8. The method of claim 1 wherein the oxidation resistant layer is a material selected from the group consisting of silicon nitride and oxynitride.

9. The method of claim 1 wherein the step of removing the disposable sidewall spacer further comprises:
   forming a recess under an edge portion of the oxidation resistant layer and exposing a portion of the substrate.

10. The method of claim 9 wherein the step of depositing the conformal layer of oxidizable material further comprises:
    covering the exposed portion of the substrate, and substantially filling the recess, before oxidizing the conformal layer of oxidizable material.

11. The method of claim 9 further comprising the step of:
    forming a stress relief layer covering the exposed portion of the substrate, the trench sidewall, and the trench bottom surface; and
    wherein the step of depositing the conformal layer of oxidizable material further comprises:
    covering the stress relief layer and substantially filling the recess before oxidizing the conformal layer of oxidizable material.

12. The method of claim 11 wherein the step of forming a stress relief layer further comprises the step of:
    oxidizing the exposed portion of the substrate, the trench sidewall, and the trench bottom surface.

13. The method of claim 11 wherein the stress relief layer is chemical vapor deposited silicon dioxide.

14. The method of claim 1 further comprising the step of:
    forming a recess under an edge portion of the oxidation resistant layer and exposing a portion of the substrate.

15. The method of claim 14 wherein the step of depositing the conformal layer of oxidizable material further comprises:
    covering the exposed portion of the substrate and substantially filling the recess, before oxidizing the conformal layer of oxidizable material.

16. The method of claim 14 further comprising the step of:
    forming a stress relief layer covering the exposed portion of the substrate, the trench sidewall, and the trench bottom surface; and
    wherein the step of depositing the conformal layer of oxidizable material further comprises:
    covering the stress relief layer and substantially filling the recess, before oxidizing the conformal layer of oxidizable material.

17. The method of claim 16 wherein the step of forming a stress relief layer further comprises the step of:
    oxidizing the exposed portion of the substrate, the trench sidewall, and the trench bottom surface.

18. The method of claim 16 wherein the stress relief layer is chemical vapor deposited silicon dioxide.

19. The method of claim 1 wherein the oxidizable material is polysilicon.

20. The method of claim 19 wherein the step of oxidizing completely consumes the polysilicon layer converting the polysilicon layer to silicon dioxide.

21. The method of claim 1 further comprising the step of:
    forming a stress relief layer on the trench sidewall, and the trench bottom surface.

22. The method of claim 21 wherein the step of depositing the conformal layer of oxidizable material further comprises:
    covering the stress relief layer before oxidizing the conformal layer of oxidizable material.

23. A method for forming an integrated circuit device on a semiconductor substrate comprising the steps of:
    forming a buffer layer overlying the substrate;
    depositing a layer of oxidation resistant material overlying the buffer layer;

etching the buffer layer and the oxidation resistant layer to leave first portions of both the buffer layer and the oxidation resistant layer overlying the substrate, and to define an isolation region of the substrate, and to form a sidewall of the first portion of the buffer layer;

depositing a conformal layer of spacer material overlying said first portion of the oxidation resistant layer and the isolation region of the substrate;

etching the spacer material to form a disposable sidewall spacer laterally adjacent to the sidewall of the first portion of the buffer layer and covering a first portion of the isolation region of the substrate, and exposing a second portion of the isolation region of the substrate;

etching said second portion of the isolation region of the substrate to form a trench region, the trench region having a trench bottom surface and a trench sidewall;

etching the disposable sidewall spacer and the sidewall of the first portion of the buffer layer to remove the disposable sidewall spacer and expose said first portion of the isolation region of the substrate, and to remove a portion of the first portion of the buffer layer under an edge portion of the first portion of the oxidation resistant layer to form a recess and expose a portion of the substrate underlying the recess;

forming a stress relief layer on the exposed portion of the substrate underlying the recess, the first portion of the isolation region of the substrate, the trench sidewall, and the trench bottom surface;

depositing a conformal layer of oxidizable material overlying the first portion of the oxidation resistant layer, the stress relief layer, and substantially filling the recess; and oxidizing the conformal layer of oxidizable material to form an oxidized conformal layer and to form electrical isolation in the isolation region of the substrate.

24. The method of claim 23 further comprising the step of:
removing portions of the oxidized conformal layer and the first portions of the oxidation resistant layer and the buffer layer.

25. The method of claim 23 further comprising the step of:
doping the trench region.

26. The method of claim 23 further comprising the step of:
depositing a dielectric layer overlying portions of the oxidized conformal layer.

27. The method of claim 26 further comprising the steps of:
removing portions of both the oxidized conformal layer and the dielectric layer resulting in said first portion of the oxidation resistant layer being substantially planar with the isolation region of the substrate; and
removing said first portions of the oxidation resistant layer and the buffer layer.

28. The method of claim 23 wherein the substrate is silicon and the step of forming a buffer layer further comprises the step of:
oxidizing silicon to form the buffer layer.

29. The method of claim 23 wherein the buffer layer is chemical vapor deposited silicon dioxide.

30. The method of claim 23 wherein the oxidation resistant material is selected from the group consisting of silicon nitride and oxynitride.

31. The method of claim 23 wherein the step of etching the disposable sidewall spacer and the sidewall of the first portion of the buffer layer comprises the steps of:
applying a first etchant to remove the disposable sidewall spacer and expose said first portion of the isolation region of the substrate; and
applying a second etchant to remove the portion of the first portion of the buffer layer under the edge portion of the first portion of the oxidation resistant layer to form the recess and expose the portion of the substrate underlying the recess.

32. The method of claim 23 wherein the step of forming a stress relief layer further comprises the step of:
oxidizing the exposed portion of the substrate underlying the recess, the first portion of the isolation region of the substrate, the trench sidewall, and the trench bottom surface.

33. The method of claim 23 wherein the stress relief layer is chemical vapor deposited silicon dioxide.

34. The method of claim 23 wherein the oxidizable material is polysilicon.

35. The method of claim 34 wherein the step of oxidizing completely consumes the polysilicon layer converting the polysilicon layer to silicon dioxide.

36. A method for forming an integrated circuit device on a semiconductor substrate comprising the steps of:
forming a buffer layer overlying the substrate;
depositing a layer of oxidation resistant material overlying the buffer layer;
etching the oxidation resistant layer to leave a first portion of the oxidation resistant layer overlying the buffer layer, and to define an isolation region of the substrate, and to form a sidewall of the first portion of the oxidation resistant layer;
depositing a conformal layer of spacer material overlying said first portion of the oxidation resistant layer and the isolation region of the substrate;
etching the spacer material and the buffer layer to form a disposable sidewall spacer laterally adjacent to the sidewall of the first portion of the oxidation resistant layer, and to leave a first portion of the buffer layer overlying the substrate, and to expose a first portion of the substrate;
etching said first exposed portion of the substrate to form a trench region, the trench region having a trench bottom surface and a trench sidewall;
etching the disposable sidewall spacer and the first portion of the buffer layer to remove the disposable sidewall spacer, and to remove a portion of the first portion of the buffer layer to form a recess under an edge portion of the first portion of the oxidation resistant layer and expose a second portion of the substrate;
forming a stress relief layer on the second exposed portion of the substrate, the trench sidewall, and the trench bottom surface;
depositing a conformal layer of oxidizable material overlying the first portion of the oxidation resistant layer, the stress relief layer, and substantially filling the recess; and
oxidizing the conformal layer of oxidizable material to form an oxidized conformal layer and to form electrical isolation in the isolation region of the substrate.

37. The method of claim 36 further comprising the step of:
removing portions of the oxidized conformal layer and the first portions of the oxidation resistant layer and the buffer layer.

38. The method of claim 36 further comprising the step of:
doping the trench region.

39. The method of claim 36 further comprising the step of:
depositing a dielectric layer overlying portions of the oxidized conformal layer.

40. The method of claim 39 further comprising the steps of:
removing portions of both the oxidized conformal layer and the dielectric layer resulting in said first portion of the oxidation resistant layer being substantially planar with the isolation region of the substrate; and
removing said first portions of the oxidation resistant layer and the buffer layer.

41. The method of claim 36 wherein the substrate is silicon and the step of forming a buffer layer further comprises the step of:
oxidizing silicon to form the buffer layer.

42. The method of claim 36 wherein the buffer layer is chemical vapor deposited silicon dioxide.

43. The method of claim 36 wherein the oxidation resistant material is selected from the group consisting of silicon nitride and oxynitride.

44. The method of claim 36 wherein the step of etching the spacer material and the buffer layer comprises the steps of:
anisotropically etching the spacer material to form the disposable sidewall spacer laterally adjacent to the sidewall of the first portion of the oxidation resistant layer, and to expose a portion of the buffer layer; and
anisotropically etching the exposed portion of the buffer layer to leave the first portion of the buffer layer overlying the substrate, and to expose the first portion of the substrate.

45. The method of claim 36 wherein the step of etching the disposable sidewall spacer and the first portion of the buffer layer comprises the steps of:
applying a first etchant to remove the disposable sidewall spacer; and
applying a second etchant to remove the portion of the first portion of the buffer layer to form the recess under an edge portion of the first portion of the oxidation resistant layer and expose the second portion of the substrate.

46. The method of claim 36 wherein the step of forming a stress relief layer further comprises the step of:
oxidizing the second exposed portion of the substrate, the trench sidewall, and the trench bottom surface.

47. The method of claim 36 wherein the stress relief layer is chemical vapor deposited silicon dioxide.

48. The method of claim 36 wherein the oxidizable material is polysilicon.

49. The method of claim 48 wherein the step of oxidizing completely consumes the polysilicon layer converting the polysilicon layer to silicon dioxide.

50. A method for forming an integrated circuit device on a semiconductor substrate comprising the steps of:
forming a buffer layer overlying the substrate;
depositing a layer of oxidation resistant material overlying the buffer layer;
depositing a masking layer overlying the oxidation resistant layer;
patterning the masking layer to leave a first portion of the masking layer overlying the oxidation resistant layer, and to expose a portion of the oxidation resistant layer, and to define a trench region of the substrate;
etching the exposed portion of the oxidation resistant layer to leave a first portion of the oxidation resistant layer overlying the buffer layer and underlying the first portion of the masking layer, and to expose a portion of the buffer layer, and to define an isolation region of the substrate;
etching the buffer layer to leave a first portion of the buffer layer overlying the substrate, and to expose a first portion of the substrate;
etching the substrate to form a trench in the trench region of the substrate, the trench having a trench bottom surface and a trench sidewall;
applying an etchant to remove the first portion of the masking layer;
depositing a conformal layer of oxidizable material overlying the first portion of the oxidation resistant layer, the trench sidewall, and the trench bottom surface; and
oxidizing the conformal layer of oxidizable material to form an oxidized conformal layer and to form electrical isolation in the isolation region of the substrate.

51. The method of claim 50 further comprising the step of:
removing portions of the oxidized conformal layer and the first portions of the oxidation resistant layer and the buffer layer.

52. The method of claim 50 further comprising the step of:
doping the trench.

53. The method of claim 50 further comprising the step of:
depositing a dielectric layer overlying portions of the oxidized conformal layer.

54. The method of claim 53 further comprising the steps of:
removing portions of both the oxidized conformal layer and the dielectric layer resulting in said first portion of the oxidation resistant layer being substantially planar with the isolation region of the substrate; and
removing said first portions of the oxidation resistant layer and the buffer layer.

55. The method of claim 50 wherein the substrate is silicon and the step of forming a buffer layer further comprises the step of:
oxidizing silicon to form the buffer layer.

56. The method of claim 50 wherein the buffer layer is chemical vapor deposited silicon dioxide.

57. The method of claim 50 wherein the oxidation resistant material is selected from the group consisting of silicon nitride and oxynitride.

58. The method of claim 50 wherein the step of etching the exposed portion of the oxidation resistant layer comprises the steps of:
anisotropically etching the exposed portion of the oxidation resistant layer to leave the first portion of the oxidation resistant layer overlying the buffer layer and underlying the first portion of the masking layer, and to form a sidewall of the first portion of the oxidation resistant layer; and isotropically etching the sidewall of the first portion of the oxidation resistant layer to remove a portion of the first portion of the oxidation resistant layer underneath the first portion of the masking layer to define the isolation region of the substrate, and to expose the portion of the buffer layer.

59. The method of claim 50 wherein the step of etching the exposed portion of the oxidation resistant layer comprises the step of:
isotropically etching the exposed portion of the oxidation resistant layer to leave the first portion of the oxidation resistant layer over lying the buffer layer and underlying the first portion of the masking layer, and to expose the portion of the buffer layer, and to define the isolation region of the substrate.

60. The method of claim 50 wherein the step of etching the buffer layer further comprises:
forming a recess under an edge portion of the first portion of the oxidation resistant layer.

61. The method of claim 60 wherein the step of depositing the conformal layer of oxidizable material further comprises:
substantially filling the recess before oxidizing the conformal layer of oxidizable material.

62. The method of claim 60 further comprising the step of:
forming a stress relief layer covering the trench sidewall, and the trench bottom surface; and
wherein the step of depositing the conformal layer of oxidizable material further comprises:
covering the stress relief layer and substantially filling the recess before oxidizing the conformal layer of oxidizable material.

63. The method of claim 62 wherein the step of forming a stress relief layer further comprises the step of:
oxidizing the trench sidewall, and the trench bottom surface.

64. The method of claim 62 wherein the stress relief layer is chemical vapor deposited silicon dioxide.

65. The method of claim 50 wherein the step of applying an etchant to remove the first portion of the masking layer further comprises:
etching a portion of the first portion of the buffer layer to form a recess under an edge portion of the first portion of the oxidation resistant layer and expose a second portion of the substrate.

66. The method of claim 65 wherein the step of depositing the conformal layer of oxidizable material further comprises:
covering the exposed second portion of the substrate and substantially filling the recess before oxidizing the conformal layer of oxidizable material.

67. The method of claim 65 further comprising the step of:
forming a stress relief layer covering the exposed second portion of the substrate, the trench sidewall, and the trench bottom surface; and
wherein the step of depositing the conformal layer of oxidizable material further comprises:
covering the stress relief layer and substantially filling the recess before oxidizing the conformal layer of oxidizable material.

68. The method of claim 67 wherein the step of forming a stress relief layer comprises the step of:
oxidizing the exposed second portion of the substrate, the trench sidewall, and the trench bottom surface.

69. The method of claim 67 wherein the stress relief layer is chemical vapor deposited silicon dioxide.

70. The method of claim 50 further comprising the step of:
etching a portion of the first portion of the buffer layer to form a recess under an edge portion of the first portion of the oxidation resistant layer and expose a second portion of the substrate.

71. The method of claim 70 wherein the step of depositing the conformal layer of oxidizable material further comprises:
covering the exposed second portion of the substrate and substantially filling the recess before oxidizing the conformal layer of oxidizable material.

72. The method of claim 70 further comprising the step of:
forming a stress relief layer covering the exposed second portion of the substrate, the trench sidewall, and the trench bottom surface; and
wherein the step of depositing the conformal layer of oxidizable material further comprises:
covering the stress relief layer and substantially filling the recess before oxidizing the conformal layer of oxidizable material.

73. The method of claim 72 wherein the step of forming a stress relief layer further comprises the step of:
oxidizing the exposed second portion of the substrate, the trench sidewall, and the trench bottom surface.

74. The method of claim 72 wherein the stress relief layer is chemical vapor deposited silicon dioxide.

75. The method of claim 50 further comprising the step of:
forming a stress relief layer on the trench sidewall, and the trench bottom surface.

76. The method of claim 75 wherein the step of depositing the conformal layer of oxidizable material further comprises:
covering the stress relief layer before oxidizing the conformal layer of oxidizable material.

77. The method of claim 75 wherein the step of forming a stress relief layer further comprises the step of:
oxidizing the trench sidewall, and the trench bottom surface.

78. The method of claim 75 wherein the stress relief layer is chemical vapor deposited silicon dioxide.

79. The method of claim 50 wherein the oxidizable material is polysilicon.

80. The method of claim 79 wherein the step of oxidizing completely consumes the polysilicon layer converting the polysilicon layer to silicon dioxide.

* * * * *